(12) United States Patent
Yamamoto et al.

(10) Patent No.: US 10,048,329 B2
(45) Date of Patent: Aug. 14, 2018

(54) MAGNETIC DETECTION DEVICE AND METHOD OF MANUFACTURING SAME

(71) Applicant: AICHI STEEL CORPORATION, Tokai-shi, Aichi-ken (JP)

(72) Inventors: Michiharu Yamamoto, Aichi-ken (JP); Tomohiko Nagao, Aichi-ken (JP)

(73) Assignee: AICHI STEEL CORPORATION, Tokai-shi, Aichi-ken (JP)

( * ) Notice: Subject to any disclaimer, the term of this patent is extended or adjusted under 35 U.S.C. 154(b) by 0 days.

(21) Appl. No.: 15/305,864

(22) PCT Filed: Mar. 12, 2015

(86) PCT No.: PCT/JP2015/057237
§ 371 (c)(1),
(2) Date: Oct. 21, 2016

(87) PCT Pub. No.: WO2015/170509
PCT Pub. Date: Nov. 12, 2015

(65) Prior Publication Data
US 2017/0160351 A1 Jun. 8, 2017

(30) Foreign Application Priority Data
May 9, 2014 (JP) .................................. 2014-097251

(51) Int. Cl.
*G01R 33/02* (2006.01)
*G01R 33/06* (2006.01)
(Continued)

(52) U.S. Cl.
CPC ........... *G01R 33/063* (2013.01); *G01C 17/30* (2013.01); *G01R 33/0052* (2013.01);
(Continued)

(58) Field of Classification Search
CPC .. G01R 33/0206; G01R 33/06; G01R 33/063; G01R 33/09; G01R 33/093;
(Continued)

(56) References Cited

U.S. PATENT DOCUMENTS 4,883,773 A 11/1989 Ishikura
6,404,192 B1 6/2002 Chiesi et al.
(Continued)

FOREIGN PATENT DOCUMENTS

DE 699 25 573 T2 4/2006
EP 1 647 830 A1 4/2006
(Continued)

OTHER PUBLICATIONS

International Search Report for PCT/JP2015/057237 dated Jun. 9, 2015.

*Primary Examiner* — Thang Le
(74) *Attorney, Agent, or Firm* — Sughrue Mion, PLLC

(57) ABSTRACT

A reduced size/thickness magnetic detection device includes: a substrate; and a magneto-impedance element at one substrate surface side and including a magneto-sensitive wire and a detection coil. The wire senses an external magnetic field component in a first axis direction in which the wire extends. The coil loops around the wire, and includes left-side and right-side coil parts coexisting along the wire, and a magnetic field direction changing body of soft magnetic material having at least a part at another substrate surface side or in the substrate above an intermediate position between left-side and right-side coil parts. The body can change an external magnetic field component in a third axis direction intersecting the substrate to a measurement magnetic field component in the first axis direction. The external magnetic field component in the third axis direction can be detected from a left-side coil part output and a right-side coil part output.

7 Claims, 11 Drawing Sheets

(51) Int. Cl.
*G01C 17/30* (2006.01)
*H01L 43/02* (2006.01)
*H01L 43/12* (2006.01)
*H01L 27/22* (2006.01)
*G01R 33/00* (2006.01)

(52) U.S. Cl.
CPC .......... *G01R 33/0206* (2013.01); *H01L 27/22* (2013.01); *H01L 43/02* (2013.01); *H01L 43/12* (2013.01)

(58) Field of Classification Search
CPC .... G01R 33/0052; G01R 33/18; G01D 5/145; G01D 5/147; G01B 7/30; G01B 7/033; G01N 27/9033; G01N 27/902; G01N 27/9013; G01N 27/904; G01N 27/223; G01N 27/82; G01N 27/9093
USPC .................................................. 324/200–263
See application file for complete search history.

(56) References Cited

U.S. PATENT DOCUMENTS

| | | | | |
|---|---|---|---|---|
| 7,145,331 | B2* | 12/2006 | Kuroe | G01R 33/02 324/249 |
| 7,298,140 | B2 | 11/2007 | Honkura et al. | |
| 7,509,748 | B2* | 3/2009 | Xue | G01C 17/28 33/355 R |
| 8,339,132 | B2 | 12/2012 | Honkura et al. | |
| 9,366,703 | B2* | 6/2016 | Gilbert | G01R 15/181 |
| 2004/0150397 | A1* | 8/2004 | Kuroe | G01R 33/02 324/249 |
| 2005/0242805 | A1 | 11/2005 | Honkura et al. | |
| 2006/0202690 | A1* | 9/2006 | Park | G01R 33/02 324/249 |
| 2012/0013332 | A1* | 1/2012 | Honkura | G01C 17/30 324/244 |
| 2013/0141089 | A1* | 6/2013 | Dyer | G01R 33/0052 324/252 |
| 2015/0262748 | A1 | 9/2015 | Nishihata et al. | |

FOREIGN PATENT DOCUMENTS

| | | |
|---|---|---|
| EP | 2 413 153 A1 | 2/2012 |
| EP | 2 908 150 A1 | 8/2015 |
| JP | 48-014275 U1 | 2/1973 |
| JP | 63-152185 A | 6/1988 |
| JP | 10-22545 A | 1/1998 |
| JP | 2001-13231 A | 1/2001 |
| JP | 2008-134236 A | 6/2008 |
| JP | 2010-101648 A | 5/2010 |
| JP | 5066576 B2 | 11/2012 |
| JP | 2014-153309 A | 8/2014 |
| WO | 2005/008268 A1 | 1/2005 |
| WO | 2009/048018 A1 | 4/2009 |
| WO | 2010/110456 A1 | 9/2010 |
| WO | 2014/054371 A1 | 4/2014 |

* cited by examiner

Magnetic flux lines

MAGNETIC DETECTION DEVICE AND METHOD OF MANUFACTURING SAME

CROSS REFERENCE TO RELATED APPLICATIONS

This application is a National Stage of International Application No. PCT/JP2015/057237 filed Mar. 12, 2015, claiming priority based on Japanese Patent Application No. 2014-097251 filed May 9, 2014, the contents of all of which are incorporated herein by reference in their entirety.

TECHNICAL FIELD

The present invention relates to a magnetic detection device (including a single body of an "MI sensor") that detects magnetism using a magneto-impedance element (referred to as an "MI element") and a method of manufacturing the same.

BACKGROUND ART

Magnetic measurement has conventionally been performed to know the orientation and the like. For example, electronic compasses and other similar devices measure a three-dimensional magnetic vector to know the accurate orientation. Measurement of the magnetic vector is performed by a magnetic sensor. Examples of such magnetic sensors include Hall elements and MR elements. In recent years, MI elements are focused on, which are entirely different in the structure and principle from such conventional elements and have incomparably high sensitivity.

MI elements utilize a magneto-impedance effect (referred to as an "MI effect") that, when a high frequency pulse current or the like is caused to flow through a magneto-sensitive wire such as an amorphous wire, its impedance varies in accordance with a magnetic field due to a skin effect. Magnetic detection of an external magnetic field and the like is possible by directly measuring the impedance variation and/or by indirectly measuring the variation of amount of magnetic flux generated in the magneto-sensitive wire, which causes the MI effect, via a detection coil (pickup coil) wound around the magneto-sensitive wire.

It should be noted, however, that MI elements can basically detect only a magnetic field component in the direction in which the magneto-sensitive wire extends. Therefore, the conventional MI sensor, as in Patent Literature (PTL) 1, has to be provided with an individual MI element for each of components of the magnetic vector to detect. For example, when measuring the three-dimensional components of an external magnetic field, it may be necessary to provide an MI element for X-axis and an MI element for Y-axis on the substrate plane (X-Y plane) and an MI element for Z-axis in the orthogonal direction to the substrate plane. This MI element for Z-axis has a certain length in the Z-axis direction like the other MI elements because of its structure. Accordingly, the conventional three-dimensional magnetic detection device is difficult to be reduced in size and thickness in the Z-axis direction.

Nowadays, MI sensors incorporating MI elements have already been built in various handheld information terminals, etc. and are required to have high performance (high sensitivity and high accuracy) and to be further reduced in size. To this end, PTL 2 proposes to omit the MI element for Z-axis and allow the MI element for X-axis and the MI element for Y-axis to measure the magnetic component in the Z-axis direction.

CITATION LIST

Patent Literature

[PTL 1]
　WO2005/008268
[PTL 2]
　WO2010/110456

SUMMARY OF INVENTION

Technical Problem

PTL 2 proposes a magnetic detection device in which, for example, a pair of MI elements for X-axis opposing each other and another pair of MI elements for Y-axis opposing each other are orthogonally arranged, a magnetic field direction changing body of a soft magnetic material is provided at the center of the MI elements, and a detection voltage obtained from each MI element is calculated thereby to obtain a magnetic component in the Z-axis direction. In this case, the MI element for Z-axis can be omitted and the magnetic detection device can thus be considerably reduced in size.

In the magnetic detection device of PTL 2, however, the pair of MI elements for X-axis or the pair of MI elements for Y-axis may have to be arranged to oppose each other. In addition, the magnetic field direction changing body may also have to be disposed at the symmetric point with respect to the MI elements and therefore the degree of freedom of the arrangement thereof and the like may be limited. Thus, the magnetic detection device of PTL 2 may leave much to be improved for a further reduced size, etc.

The present invention has been made in view of such circumstances and an object of the present invention is to provide a magnetic detection device that can be further reduced in size and thickness than the conventional ones and a method of manufacturing the same.

Solution to Problem

As a result of intensive studies to achieve the above object and repeating trial and error, the present inventors have conceived of an idea that a soft magnetic body (magnetic field direction changing body) is disposed, for example, on an extension from an intermediate position of a detection coil that constitutes an MI element for X-axis or an MI element for Y-axis (on the direction intersecting a substrate), and an magnetic component in the Z-axis direction which is an extending direction of the soft magnetic body is calculated on the basis of a detected voltage obtained from the MI element for X-axis or the MI element for Y-axis thereby to omit an MI element for Z-direction. Further developing this achievement, the present inventors have accomplished a set of aspects of the present invention as will be described hereinafter.

«Magnetic Detection Device»

(1) According to an aspect of the present invention, there is provided a magnetic detection device comprising: a substrate; and a first magneto-impedance element (referred to as an "MI element") disposed at one surface side of the substrate and comprising a first magneto-sensitive wire and a first detection coil. The first magneto-sensitive wire senses an external magnetic field component in a first axis direction in which the first magneto-sensitive wire extends. The first detection coil loops around the first magneto-sensitive wire. The magnetic detection device has features as below. The first detection coil comprises a left-side coil part and a right-side coil part that coexist along the first magneto-sensitive wire. The magnetic detection device further comprises a magnetic field direction changing body composed of a soft magnetic material of which at least a part is disposed at another surface side of the substrate or in the substrate above a position that is symmetric with respect to the left-side coil part and the right-side coil part. The magnetic field direction changing body is able to change an external magnetic field component in a third axis direction to a measurement magnetic field component in the first axis direction. The third axis direction intersects the substrate. The external magnetic field component in the third axis direction is able to be detected on the basis of a left-side output obtained from the left-side coil part and a right-side output obtained from the right-side coil part.

(2) Under ordinary circumstances, the magneto-sensitive wire disposed at one surface side of the substrate cannot sense the external magnetic field component (referred simply to as a "magnetic component") in another axis direction (third axis direction) intersecting the substrate. The magnetic field direction changing body according to the present invention changes the direction of the magnetic component in the other axis direction (third axis direction) to the measurement magnetic field component in the one axis direction (first axis direction) which can be sensed by the magneto-sensitive wire. In addition, at least a part of the magnetic field direction changing body is disposed at the other surface side of the substrate or in the substrate above a position that is symmetric with respect to the left-side coil part and the right-side coil part which constitute the detection coil of one MI element (e.g. above an intermediate position between the left-side coil part and the right-side coil part, above an intermediate position of each coil, or the like). Therefore, without providing a pair of MI elements, one MI element can detect the magnetic component in the other axis direction (third axis direction) on the basis of the left-side output obtained from the left-side coil part and the right-side output obtained from the right-side coil part. This allows suppression of the height in the direction intersecting the substrate of the magnetic detection device (height in the third axis direction). Moreover, the degree of freedom in arranging the MI element and the degree of freedom in designing the magnetic detection device are enhanced and the magnetic detection device can readily be further reduced in thickness and size and can have high performance.

(3) The present invention can be carried out, provided that the magnetic detection device comprises at least one MI element and the MI element can detect the magnetic component in the direction intersecting the substrate (in particular, the direction orthogonal to the substrate) on which the MI element is mounted (the magnetic component in the other axis direction). Therefore, the MI element may not necessarily have to be utilized for detection of the magnetic component in the one axis direction in which the MI element extends, provided that the MI element is utilized for detection of the magnetic component in the other axis direction. In consideration of reduction in the thickness, size, cost, and the like of the magnetic detection device, however, it is preferred that one MI element can detect the magnetic components in the both axis directions. Such detection of two directional components by one MI element can be easily performed by switching the calculation which uses the left-side output and the right-side output.

For example, when the left-side coil part and the right-side coil part have the same number of turns, the difference or sum of the left-side output and right-side output may be switched for calculation in accordance with winding directions of the left-side coil part and right-side coil part thereby to enable detection of both the magnetic component in the one axis direction and the magnetic component in the other axis direction. More specifically, when the winding directions of the left-side coil part and right-side coil part are the same, the magnetic component in the other axis direction can be detected on the basis of the difference between the left-side output and the right-side output, while the magnetic component in the one axis direction can be detected on the basis of the sum of the left-side output and right-side output. When the winding directions (or wiring methods) of the coil parts are reversed, the calculations of the outputs can be reversely performed to obtain the same results. The magnetic detection device of the present invention may preferably comprise a calculation circuit that detects the magnetic component in each direction on the basis of the output from each coil part. More specifically, this calculation circuit may preferably include a switching circuit that switches between the difference and the sum of the left-side output and right-side output to enable detection of both the magnetic component in the one axis direction (first axis direction) and the magnetic component in the other axis direction (third axis direction).

When the magnetic detection device of the present invention detects three-dimensional components (e.g. X-component, Y-component, and Z-component) of an external magnetic field, at least one MI element may be further provided at one surface side of the substrate to detect the magnetic component in a second axis direction that is different from the first axis direction. That is, the magnetic detection device of the present invention may preferably further comprise a second MI element disposed at the one surface side of the substrate and comprising a second magneto-sensitive wire and a second detection coil. The second magneto-sensitive wire extends in the second axis direction different from the first axis direction and senses the magnetic component in the second axis direction. The second detection coil loops around the second magneto-sensitive wire.

The second MI element may not necessarily have to detect the magnetic component in the third axis direction. When, however, the second MI element can independently detect the magnetic component in the third axis direction like the first MI element, both detection results can be utilized to accurately detect the magnetic component in the third axis direction. In the magnetic detection device of the present invention, a plurality of the first MI elements which detect the magnetic component in the first axis direction and/or a plurality of the second MI elements which detect the magnetic component in the second axis direction may be disposed on one surface side of the substrate. Even when one MI element cannot obtain sufficient sensitivity, the plurality of MI elements may be provided to obtain a higher output, thus enhancing the sensitivity. More preferably, all or part of these MI elements may detect the magnetic component in the third axis direction intersecting the substrate, via individual magnetic field direction changing bodies or a common magnetic field direction changing body.

In the above-described present invention, a case of the magnetic detection device suitable for reduced thickness and size is described, in which one or more MI elements are disposed at one surface side of the substrate while one or more magnetic field direction changing bodies are disposed in the substrate or disposed at the other surface side of the substrate. However, the specific number and method of arrangement (combination) of the magnetic field direction changing bodies and the like are not limited, provided that each magnetic field direction changing body is disposed above an intermediate position of at least one detection coil (the intermediate position has not necessarily to be the center). Unless falling outside the scope of the present invention, the MI element or elements and the magnetic field direction changing body or bodies may be respectively disposed at one surface side and the other surface side of the substrate, for example, or may also be disposed at the same surface side of the substrate. It is also preferred that at least one magnetic field direction changing body (primary magnetic field direction changing body) is disposed above an intermediate position of the detection coil while another magnetic field direction changing body (subsidiary magnetic field direction changing body) is disposed at an end portion of the detection coil (in the vicinity of the end of detection coil) or the like. According to this structure, the external magnetic field component in the other axis direction of which the magnetism is collected and the direction is changed by the primary magnetic field direction changing body can be readily changed in direction to the direction having the component in the one axis direction of the detection coil, which may be preferred. The subsidiary magnetic field direction changing body may not necessarily have to be located at the end portion of the detection coil and may also be located at an intermediate position of the detection coil (e.g. an intermediate position between the center portion and end portion of the detection coil), provided that the subsidiary magnetic field direction changing body is not located on the same axis as that of the primary magnetic field direction changing body (on the third axis) (provided that the subsidiary magnetic field direction changing body is located at each of both sides of the primary magnetic field direction changing body). It is preferred that the primary magnetic field direction changing body and/or the subsidiary magnetic field direction changing body are disposed in the substrate (such as by embedding) because in this case the magnetic detection device can be further reduced in thickness and size.

When the magnetic field direction changing bodies are symmetrically arranged, it is preferred to dispose the primary magnetic field direction changing body above the center of the detection coil and dispose a pair of the subsidiary magnetic field direction changing bodies at the right end side of the right-side coil (in the vicinity of the right end) and at the left end side of the left-side coil (in the vicinity of the left end). The primary magnetic field direction changing body and the subsidiary magnetic field direction changing body may be located in the substrate or may also be located at the same surface side of the substrate or at different surface sides of the substrate. When a pair of the subsidiary magnetic field direction changing bodies is present, it is preferred that both the subsidiary magnetic field direction changing bodies are located in the substrate or at the same surface side of the substrate because in this case the symmetry can be ensured.

When the magnetic detection device of the present invention is further reduced in size (including thickness), making the magnetic field direction changing body simply in a reduced size may deteriorate the ability of integrating magnetic field (ability of collecting magnetism) in one magnetic field direction changing body. In this regard, it may be considered to dispose a plurality of small magnetic field direction changing bodies at intermediate positions of the detection coil or dispose another magnetic field direction changing body, in addition to the magnetic field direction changing body disposed at an intermediate position of the detection coil, at a position outside the intermediate region of the detection coil (e.g. at each of both end sides of the detection coil).

When a plurality of the magnetic field direction changing bodies is disposed at intermediate positions of the detection coil, it is preferred to divide the detection coil into a plurality of coils corresponding to the magnetic field direction changing bodies. For example, when n magnetic field direction changing bodies are disposed, the detection coil may be divided into n coils (n is a positive integer) and the magnetic field direction changing bodies may be arranged at intermediate positions of respective divided coil parts. Each of the divided coil parts as referred to herein also comprises a left-side coil part (left-side divided coil part) and a right-side coil part (right-side divided coil part). In other words, one detection coil is divided into n left-side divided coil parts and n right-side divided coil parts. Thus, in the present description, a pair of the left-side divided coil part and the right-side divided coil part is regarded as one unit, and the number of units is the division number.

(4) The magnetic detection device of the present invention may be an MI sensor comprising one or more MI elements or may also be an information terminal, measurement apparatus, or the like of various types comprising the MI sensor. The magnetic detection device of the present invention may preferably include, in addition to the MI element comprising the magneto-sensitive wire and the detection coil, a pulse oscillation circuit that supplies a high-frequency voltage (current) to the magneto-sensitive wire, a signal processing circuit that samples and outputs the detected voltage obtained from the detection coil (in particular, each coil part), a calculation circuit that performs calculation on the basis of such outputs to calculate the magnetic component in each direction, and other necessary circuits. In particular, when the magnetic detection device of the present invention is an MI sensor, it is preferred that these circuits are formed as an integrated circuit (drive circuit) in the substrate on which the MI element is mounted because in this case the MI sensor can be reduced in thickness and size. Mounting of the MI element to the substrate may be performed by wire bonding or flip-chip bonding, in particular using a wafer-level CSP (Chip Size Package), which may be preferred for further reducing the thickness and size of the MI sensor.

«Method of Manufacturing Magnetic Detection Device»

The magnetic detection device of the present invention can be obtained by various methods of manufacturing, but efficient production is possible using a method of manufacturing of the present invention as below. That is, it is preferred to use a method of manufacturing magnetic detection devices, the magnetic detection devices each comprising: a substrate; an MI element disposed at one surface side of the substrate and comprising a magneto-sensitive wire and a detection coil, the magneto-sensitive wire sensing an external magnetic field component in one axis direction in which the magneto-sensitive wire extends, the detection coil looping around the magneto-sensitive wire; and a magnetic field direction changing body composed of a soft magnetic material of which at least a part is disposed at another surface side of the substrate or in the substrate above an intermediate position of the detection coil, the magnetic field direction changing body being able to change an external magnetic field component in another axis direction intersecting the substrate to a measurement magnetic field having a component in the one axis direction, the method being characterized by comprising a dividing step of dividing a united base substrate into a plurality of the magnetic detection devices, the united base substrate comprising: a base substrate before division that can be a plurality of the substrates; a plurality of the MI elements mounted at one surface side of the base substrate; and a plurality of the magnetic field direction changing bodies disposed at another surface side of the base substrate or in the base substrate so as to correspond to positions of the MI elements.

Here, the united base substrate may be, for example, a bonded base substrate obtained through a bonding step of bonding a direction changing body pattern plate to a mounting base substrate, wherein the mounting base substrate is configured such that the MI elements are mounted on predetermined positions at the one surface side of the base substrate before division, wherein the direction changing body pattern plate is configured such that direction changing body patterns corresponding to the predetermined positions of the MI elements are formed on a soft magnetic plate before division that can be the magnetic field direction changing bodies, wherein the direction changing body pattern plate is bonded to another surface side of the mounting base substrate. In this case, the dividing step is a step of dividing the bonded base substrate into a plurality of the magnetic detection devices.

When the base substrate is an embedding base substrate in which the magnetic field direction changing bodies are embedded, the united base substrate may be obtained, for example, through a mounting step of mounting the plurality of MI elements on predetermined positions corresponding to the magnetic field direction changing bodies at one surface side of the embedding base substrate. Such an embedding base substrate may be obtained, for example, through a step of forming the magnetic field direction changing bodies by means of plating of the soft magnetic material and a step of forming a resin layer that embeds the magnetic field direction changing bodies, such as using photolithography.

«Others»

(1) The "detection coil" as referred to in the present description may be obtained by actually winding a wire, but may preferably be configured using a wiring pattern formed, such as by photolithography, because the magnetic detection device can be further reduced in thickness and size. The present invention can be carried out, provided that the detection coil has the left-side coil part and the right-side coil part, and another coil may be present or absent. Specs that affect the magnitude of the output voltage, such as the number of coil turns, winding diameter of coil, and the like of the left-side coil part and right-side coil part, may be different, but may preferably be the same because, when the magnetic field direction changing body is disposed at the center between the left-side coil part and the right-side coil part, the absolute values of outputs of the two coils are equal thereby to allow the above-described calculation to be easy. The position at which the magnetic field direction changing body is disposed may be within a range of one detection coil, but may preferably be located at a position corresponding to the center between the left-side coil part and the right-side coil part and in the direction orthogonal to the substrate because in this case the calculation is easy.

(2) The "direction changing" as referred to in the present description refers to changing the direction of a magnetic component that is not sensed by the magneto-sensitive wire to a direction in which the magneto-sensitive wire can sense it. This direction changing allows the magneto-sensitive wire to detect at least a part of the magnetic component which would not be sensed by the magneto-sensitive wire under ordinary circumstances.

(3) The "external magnetic field" as referred to in the present description is a magnetic field (environmental magnetic field) that acts on the magnetic detection device from the external and is to be a substantial detection object by the magnetic detection device. The "measurement magnetic field" refers to a magnetic field that is actually sensed by the magneto-sensitive wire and detected or measured by the MI element, among external magnetic fields affected by the magnetic field direction changing body. The "first," "second," "third," "one," "another (other)," "one surface side," "another (other) surface side," "left-side," "right-side," and the like as referred to in the present description are merely used for descriptive purposes to distinguish each member or each part and they do not have special meanings.

DESCRIPTION OF EMBODIMENTS

Figure 1A:
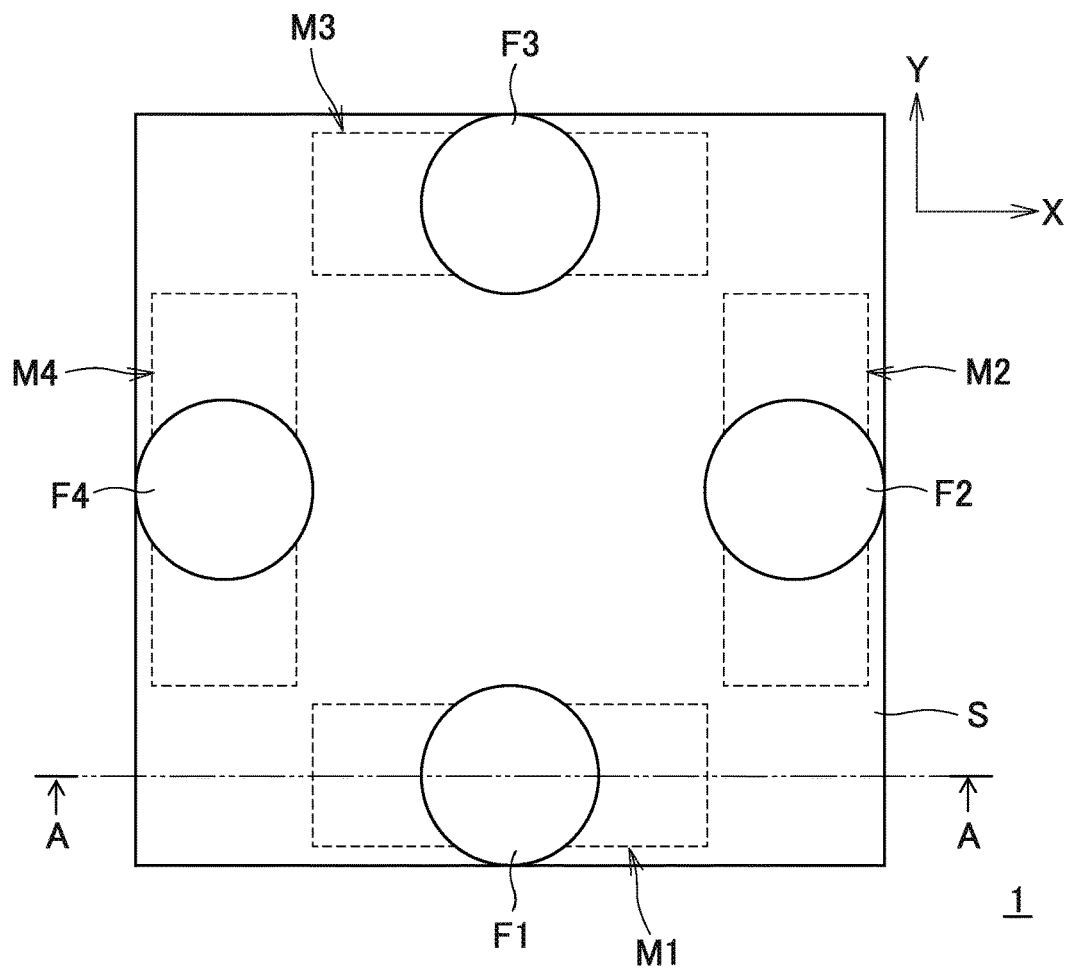
FIG. 1A is a plan view illustrating an MI sensor according to a first example.

One or more features freely selected from the present description may be added to the above-described features of the present invention. The contents described in the present description may be applied not only to the magnetic detection device of the present invention but also to a method of manufacturing the same. Features regarding the method of manufacturing, when understood as product-by-process claim, may also be features regarding a product. Which embodiment is the best or not is different in accordance with objectives, required performance, and other factors.

«MI Element»

The MI element according to the present invention has a magneto-sensitive wire that can sense magnetism such as an external magnetic field to generate the impedance variation and/or the variation of amount of magnetic flux and a detection coil as a detection means that detects the amount of variation in the magneto-sensitive wire. The magneto-sensitive wire is composed, for example, of a wire (wire rod) having an appropriate length or a thin film of a soft magnetic material. In particular, an amorphous wire of zero magnetostriction is preferred as the magneto-sensitive wire in view of the sensitivity, cost, and the like. This amorphous wire is a wire of Co—Fe—Si—B-based alloy having a diameter of 1 to 30 micrometers, for example, and details thereof are described in JP4650591B, etc.

The magneto-sensitive wire may be provided in contact with the mounting surface, provided above the mounting surface via an insulator or the like, or provided to be embedded in a groove or the like. The detection coil may be sufficient, provided that it winds around the magneto-sensitive wire in accordance with such an arrangement form of the magneto-sensitive wire, but forming the magneto-sensitive wire using photolithography is preferred because the MI element can be reduced in thickness and size.

«Magnetic Field Direction Changing Body»

The form of the magnetic field direction changing body is not limited, provided that it can change the direction of the magnetic component in the other axis direction intersecting the substrate on which the magneto-sensitive wire is disposed to the extending direction (the one axis direction) of the magneto-sensitive wire. The magnetic field direction changing body can take various forms, such as column-like (solid cylinder-like, rectangular column-like, etc.), hollow cylinder-like, and plate-like forms, in accordance with the number and arrangement of the MI elements. When a plurality of MI elements is mounted on the same substrate, an individually separated magnetic field direction changing body may be provided for each MI element, or an integrated magnetic field direction changing body may be provided to correspond to the arrangement of the MI elements.

In order to detect with high sensitivity the magnetic component in the other axis direction intersecting the substrate using the MI element disposed on the substrate, it is preferred that the magnetic field direction changing body has an enhanced effect of collecting magnetism (lens effect) and effect of changing direction for the external magnetic field. To this end, it is preferred for the magnetic field direction changing body to have a contracted part at a near side to the (first) magneto-sensitive wire and have an expanded part at a far side from the magneto-sensitive wire. In this case, the magnetic component in the other axis direction (third axis direction) passing through the expanded part is converged into the contracted part and efficiently guided to the MI element (magneto-sensitive wire), and the magnetic component can be detected with higher sensitivity. Specific profile of the magnetic field direction changing body having the contracted part and expanded part is not limited, provided that it has the above effect of collecting magnetism. The magnetic field direction changing body may, for example, have a shape that has a straight slant height line or straight lateral edges from the expanded part to the contracted part (tapered shape such as a frustum of circular cone and frustum of pyramid) or may also have a shape that has a curved slant height line or curved lateral edges from the expanded part to the contracted part (tapered shape). In an alternative embodiment, the magnetic field direction changing body may have a stepwise shape in which the cross-sectional area varies in a stepwise manner (2 or more steps).

Such magnetic field direction changing bodies can be manufactured using various methods, but the magnetic field direction changing bodies used for MI elements are very small (outer diameter or height is 0.5 mm or less) and may have to be provided to accurately correspond to the arrangement of the MI elements. Therefore, the magnetic field direction changing bodies may preferably be formed by preparing a direction changing body pattern plate in which direction changing body patterns are formed on a soft magnetic plate using half etching, bonding the direction changing body pattern plate to a mounting base substrate on which a plurality of the MI elements are mounted, and dividing them into a plurality of pieces.

According to the half etching to etch one surface side of the soft magnetic plate while leaving the other surface side, a direction changing body pattern plate can be effectively manufactured in which a number of small magnetic field direction changing bodies are accurately arranged. This direction changing body pattern plate is in a state in which a number of the magnetic field direction changing bodies are combined, and they can thus be collectively handled. Therefore, alignment with a number of MI elements mounted on the base substrate can be accurately and easily performed. Moreover, the degree of freedom in the shape of magnetic field direction changing body is large because etching is utilized, and the formation of the above contracted part and expanded part is easy. For example, the soft magnetic plate is half-etched, the etched parts are filled with resin, and direction changing body patterns are formed such that frustum-like islands to be the magnetic field direction changing bodies are regularly dotted at one surface side of the soft magnetic plate. The direction changing body pattern plate thus obtained is etched from the surface at the expanded part side to divide the integrated magnetic field direction changing bodies in a state of being combined into individual bodies. By filling the etched part with resin, the direction changing body pattern plate can be easily obtained in a state in which a plurality of the magnetic field direction changing bodies each having the contracted part and expanded part is regularly arranged. When this direction changing body pattern plate is already bonded to the mounting base substrate in the previous step, a plurality of the magnetic detection devices can thereafter be easily manufactured by division. In an alternative embodiment, division into the direction changing bodies may also be performed before bonding.

The magnetic field direction changing body can also be manufactured through a step of plating a soft magnetic material, such as using photolithography. In an alternative embodiment, a united base substrate may be made through preparing an embedding base substrate in which a plurality of the magnetic field direction changing bodies thus formed is surrounded by (embedded in) resin and mounting (equipping) a plurality of the MI elements on the embedding base substrate (mounting step). In this case, the magnetic field direction changing bodies and the MI elements can be more easily and accurately aligned with one another and can be more closely arranged. Furthermore, individual MI sensors (magnetic detection devices) obtained by dividing (separating) such a united base substrate have the magnetic field direction changing bodies in the substrates equipped with the MI elements thereon and can be not only reduced in thickness and size but also excellent in the handling ability and general versatility.

As the soft magnetic material which constitutes the magnetic field direction changing bodies (or the direction changing body pattern plate) has a higher magnetic permeability, it is more preferred because the effect of collecting magnetism is higher. For example, permalloy, pure Ni, pure iron, sendust, permendur, and the like may preferably be used.

EXAMPLES

First Example

<Device Overview>

Figure 1B:
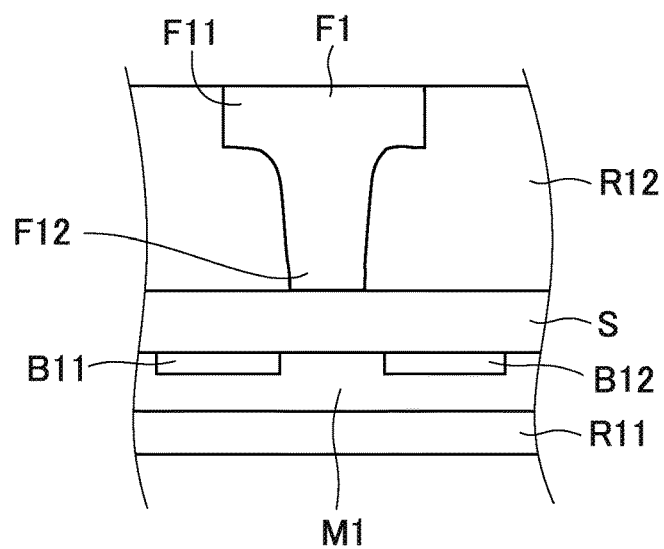
FIG. 1B is a partial cross-sectional view along line A-A illustrated in the plan view.

FIG. 1A is a plan view of an MI sensor 1 as an example according to the magnetic detection device of the present invention. FIG. 1B is a partial cross-sectional view along line A-A illustrated in FIG. 1A.

The MI sensor 1 has four MI elements M1 to M4 that detect an external magnetic field such as geomagnetism, four magnetism collecting yokes F1 to F4 (magnetic field direction changing bodies) each having a shape approximately of frustum of circular cone, a circuit substrate S (corresponding to the "substrate" as referred to in the present invention) configured such that an integrated circuit (ASIC: application specific integrated circuit) including a pulse oscillation circuit (drive circuit), a signal processing circuit, a calculation circuit, and other necessary circuits are formed on a Si substrate, and insulating resin layers R11 and R12 formed respectively on the upper surface and lower surface of the circuit substrate S. As illustrated in FIG. 1B, bumps B11 and B12 are formed around the MI element M1 to achieve a wafer-level CSP without wire bonding for electric connection between the integrated circuit and the MI element. Unless otherwise stated, each circuit and other components are formed by photolithography.

In order for the MI sensor 1 to detect three-dimensional components of the external magnetic field, the MI elements M1 to M4 are mounted on the circuit substrate S in a square shape using flip-chip bonding. The MI elements M1 and M3 mounted parallel to the X-axis direction detect the magnetic component in the X-axis direction (referred simply to as an "X-component") while the MI elements M2 and M4 mounted parallel to the Y-axis direction detect the magnetic component in the Y-axis direction (referred simply to as a "Y-component").

In order to enable these MI elements M1 to M4 also to detect the magnetic component in the Z-axis direction (referred simply to as a "Z-component"), the magnetism collecting yokes F1 to F4 are disposed at the reverse side of the circuit substrate S so as to correspond to center positions of the MI elements M1 to M4, respectively. The MI elements M1 to M4 are the same while the magnetism collecting yokes F1 to F4 are also the same, so the description below will be made representatively for the MI element M1 and the magnetism collecting yoke F1, and the description for other MI elements M2 to M4 and magnetism collecting yokes F2 to F4 will be omitted.

The magnetism collecting yoke F1 is composed of a permalloy (78 mass % Ni—Fe) of a high magnetic permeability (mu=180,000) and has an expanded part F11 with a shape of large-diameter solid cylinder and a contracted part F12 with a shape of frustum of circular cone in which the cross section decreases smoothly from the expanded part F11. The presence of the magnetism collecting yoke F1 allows the magnetic flux lines of the external magnetic field to be changed in direction. In particular, the Z-component of the external magnetic field passing through the expanded part F11 is collected into the magnetism collecting yoke F1 of a high magnetic permeability and guided to converge into the end surface side of the contracted part F12 (the other surface side of the circuit substrate S). The converged magnetic flux lines of the external magnetic field (in particular, its Z-component) pass from the end surface of the contracted part F12 through the circuit substrate S and spread radially (equally in the right and left directions) from the center of the MI element M1 (see FIG. 5). To enhance this phenomenon, other magnetic field direction changing bodies may be provided in the vicinities of both ends of the MI element M1 located at the opposite side of the magnetism collecting yoke F1 with respect to the circuit substrate S (lower side in FIG. 5) (see FIG. 10 to be described later). In this case, the magnetic flux lines spread from the contracted part F12 of the magnetism collecting yoke F1 can be further changed in direction toward the wire axis direction of the MI element M1.

Figure 2:
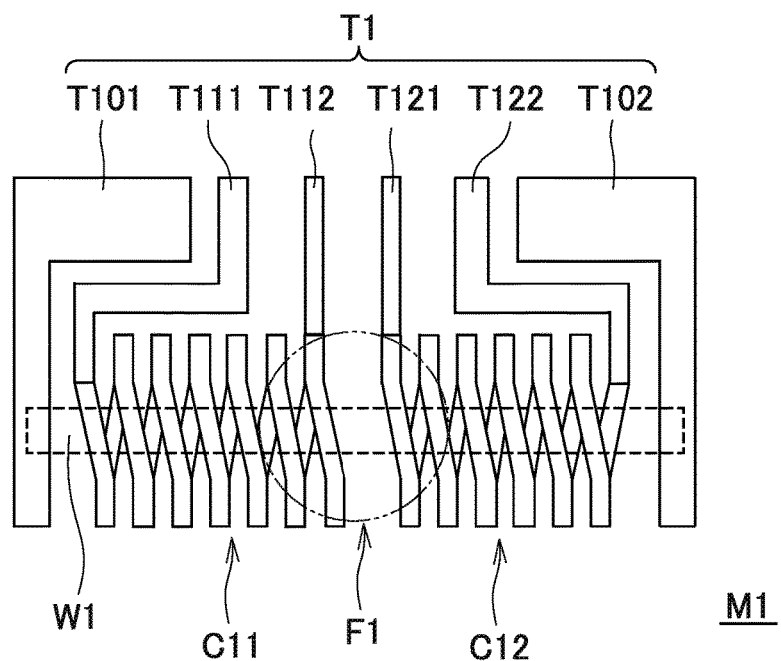
FIG. 2 is a plan view illustrating the overview of an MI element.

As illustrated in FIG. 2, the MI element M1 comprises a magneto-sensitive wire W1, a detection coil C1 wound around the magneto-sensitive wire W1, and a set of terminals T1 connected to the magneto-sensitive wire W1 and detection coil C1. The magneto-sensitive wire W1 is composed of an amorphous wire of zero magnetostriction made of a Co—Fe—Si—B-based alloy. The detection coil C1 comprises a left-side coil part C11 and a right-side coil part C12. The left-side coil part C11 and the right-side coil part C12 have the same specs, such as the number of turns, winding diameter, winding direction, and pitch, which affect the magnitude of output, and are formed symmetrically with respect to the center position (point) which the center axis of the magnetism collecting yoke F1 passes through. The coil parts C11 and C12 and the set of terminals T1 are formed on the circuit substrate S using photolithography. The set of terminals T1 comprises terminals T101 and T102 for supplying a pulse signal to the magneto-sensitive wire W1, terminals T111 and T112 that output the electromotive force generated in the left-side coil part C11, and terminals T121 and T122 that output the electromotive force generated in the right-side coil part C12.

Figure 3:
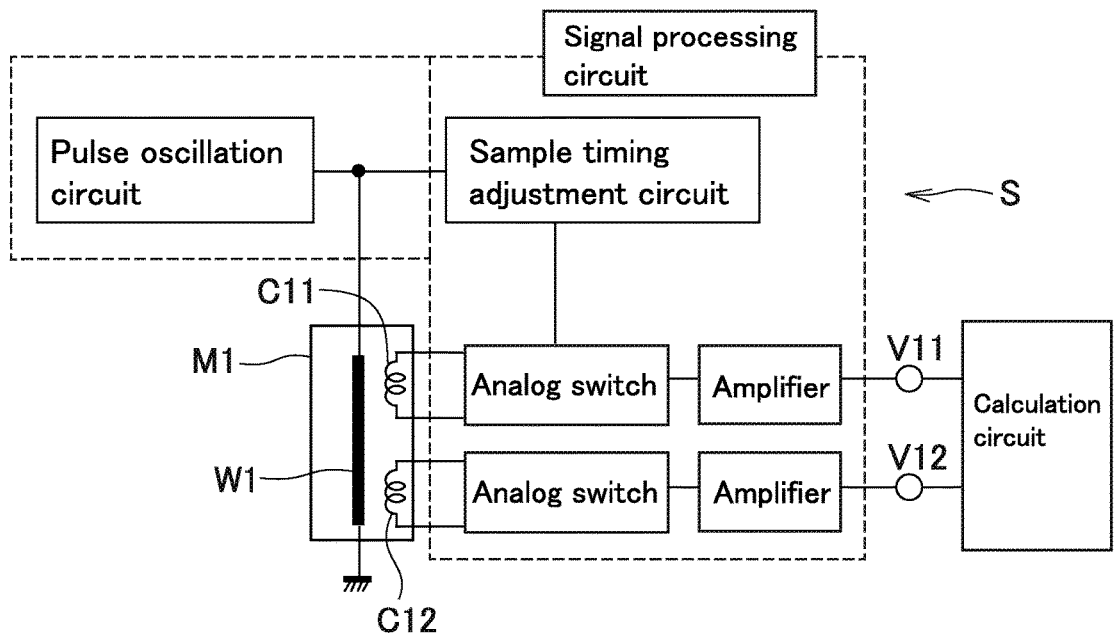
FIG. 3 is an electric circuit diagram of an MI sensor using the MI element.

As illustrated in FIG. 3, the integrated circuit (ASIC) formed on or in the circuit substrate S comprises a pulse oscillation circuit (drive circuit) that supplies a pulse signal to the magneto-sensitive wire W1, a signal processing circuit that acquires an output (voltage) V11 from the left-side coil part C11 and an output (voltage) V12 from the right-side coil part C12, and a calculation circuit (including a switching circuit).

Figure 4A:
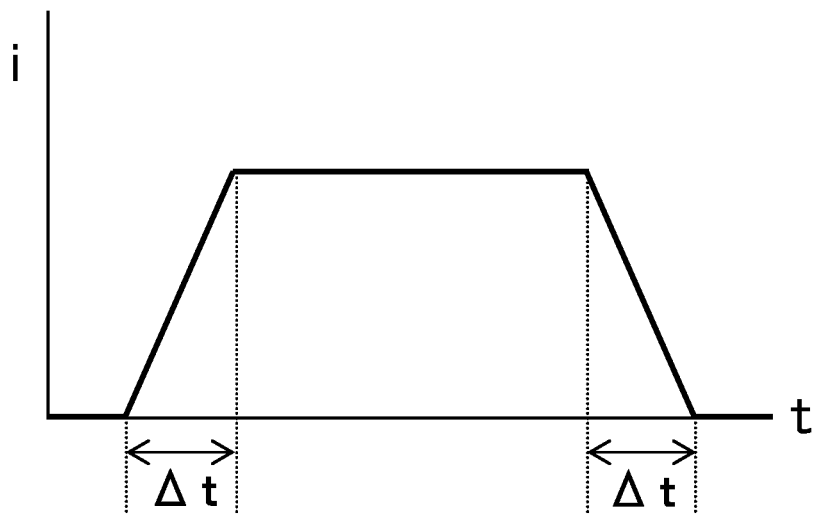
FIG. 4A is a waveform chart illustrating a pulse current waveform to be applied to the MI element.
Figure 4B:
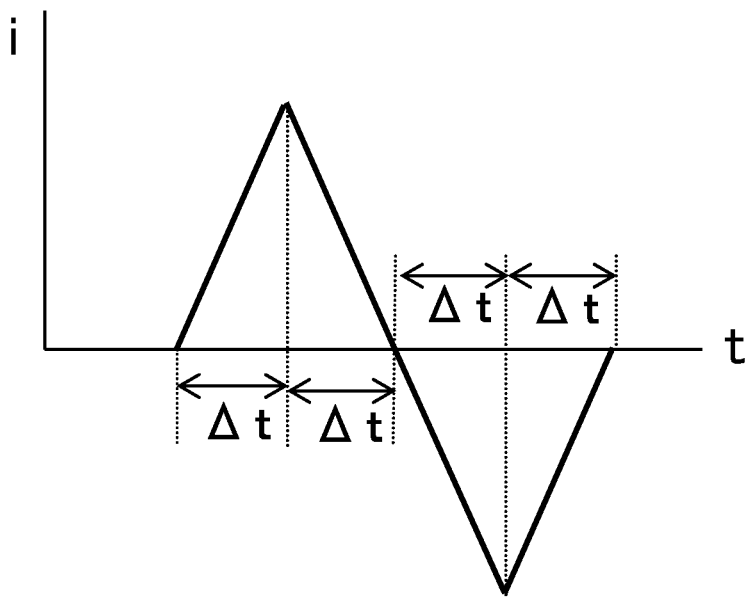
FIG. 4B is a view for explaining a method of obtaining a frequency from rise time and/or fall time of the pulse current waveform.

The pulse oscillation circuit and the signal processing circuit operate as follows. First, a pulse current having a high frequency (e.g. corresponding to 200 MHz) generated by the pulse oscillation circuit is supplied to the magneto-sensitive wire W1. This pulse current causes an interaction between the magnetic field generated in a circumferential direction of the magneto-sensitive wire W1 and the external magnetic field, and the left-side coil part C11 and the right-side coil part C12 each generate a voltage corresponding to the magnetic component which acts in the axis direction. The frequency as referred to herein is obtained by measuring the "rise" or "fall" time, delta-t, of a pulse of the pulse current waveform illustrated in FIG. 4A and assuming that the delta-t corresponds to one fourth of a period as illustrated in FIG. 4B.

Next, after the above pulse current rises, a sample timing adjustment circuit in the signal processing circuit turns on and off analog switches for a short time at a predetermined timing. This operation allows the analog switches to sample respective voltages generated in the left-side coil part C11 and right-side coil part C12. The sampled voltages are amplified by respective amplifiers and outputs V11 and V12 are thus obtained. The outputs V11 and V12 can also be obtained by processing when the pulse current is shut off (the pulse current falls) rather than when the pulse current rises.

The calculation circuit calculates alternately the sum and difference of the output V11 and output V12 to provide an output indicative of the X-component of the external magnetic field on the basis of the sum of the output V11 and output V12 and provide an output indicative of the Z-component of the external magnetic field on the basis of the difference between the output V11 and the output V12. The reason that the sum and difference can provide outputs indicative of the X-component and Z-component will be described below.

<Magnetic Field Detection>

Figure 5:
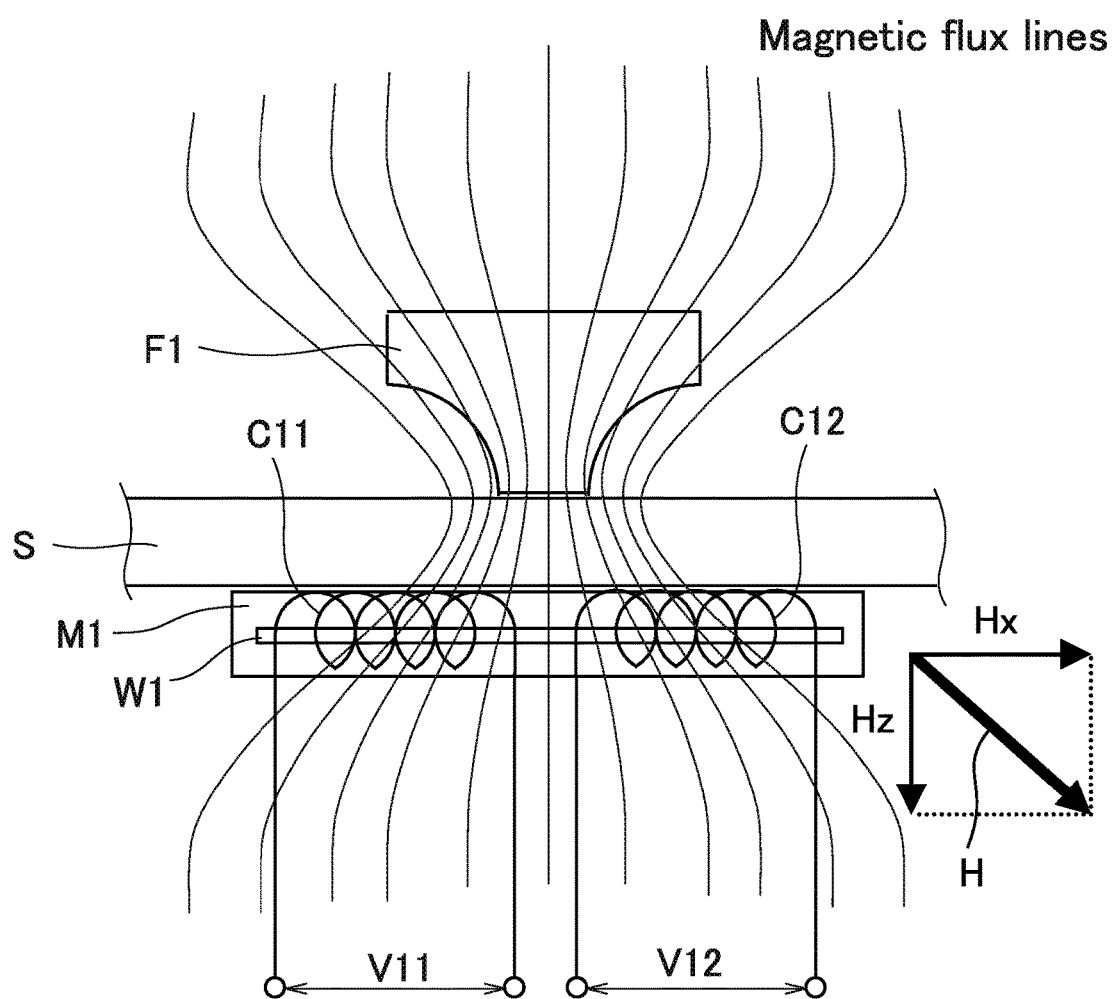
FIG. 5 is a view illustrating magnetic flux lines in the Z-axis direction which act on the MI sensor.

The magnetic flux lines (magnetic field lines) generated around the MI element M1 can be changed in direction into each direction by the magnetism collecting yoke F1. In particular, as illustrated in FIG. 5, the magnetic flux lines of the Z-component (component in the direction orthogonal to the circuit substrate S) of the external magnetic field are significantly changed in direction by the magnetism collecting yoke F1. Note, however, that the effects by the direction change of the external magnetic field to the outputs appearing at the coil parts are symmetric because the magnetism collecting yoke F1 is disposed at the center between the symmetric left-side coil part C11 and right-side coil part C12 of the MI element M1.

Observation will now be made to a direction-changed magnetic component (measurement magnetic field/magnetic vector H) that reflects the Z-component of the external magnetic field of which the direction is changed by the magnetism collecting yoke F1. As previously described, all the specs affecting the magnitude of outputs are the same in the left-side coil part C11 and the right-side coil part C12. Therefore, the effect of the component in the X-axis direction of the original external magnetic field caused around the MI element M1 is canceled, and the output difference between the output V11 of the left-side coil part C11 and the output V12 of the right-side coil part C12 (V11−V12) reflects only the effect of a further X-component (Hx) of the direction-changed magnetic component which acts on the left-side coil part C11 and the right-side coil part C12 in opposite directions. Of course, the Z-component (Hz) of the direction-changed magnetic component does not affect the above output difference because the magneto-sensitive wire W1 does not sense the Z-component (Hz). The Z-component of the original external magnetic field can thus be obtained from the output difference through calculation of multiplying the output difference by an appropriate coefficient.

In the output sum of the output V11 and output V12 (V11+V12), the effect of the X-component (Hx) of the direction-changed magnetic component is canceled, and the Z-component (Hz) of the direction-changed magnetic component also does not affect the output sum as described above. Therefore, the output sum reflects only the effect of a further X-component (projection component in the X-axis direction) of the magnetic component which is caused due to the X-component of the original external magnetic field being changed in direction by the magnetism collecting yoke F1. The X-component of the original external magnetic field can thus be obtained from the output sum through calculation of multiplying the output sum by an appropriate coefficient. Such situations are the same in the MI element M3. The Y-component and the Z-component can also be detected using the MI element M2 and the MI element M4 in a similar manner to the above.

It is preferred that the component of each axis direction of the external magnetic field is calculated on the basis of an average value (e.g. arithmetic average) of outputs from a plurality of MI elements rather than on the basis of an output from one MI element. As will be understood, the output value can be coupled with an appropriate correction coefficient and/or an appropriate correction term in consideration of the shape of the magnetism collecting yoke, the arrangement and characteristics of the MI element, and other factors. Such arithmetic processing may be executed on the above-described calculation circuit or may also be executed using a program for an information terminal or the like to be equipped with the MI sensor 1. Basic idea as for the arithmetic processing is also described in detail in WO2010/110456, etc.

<Method of Manufacturing>

Figure 6:
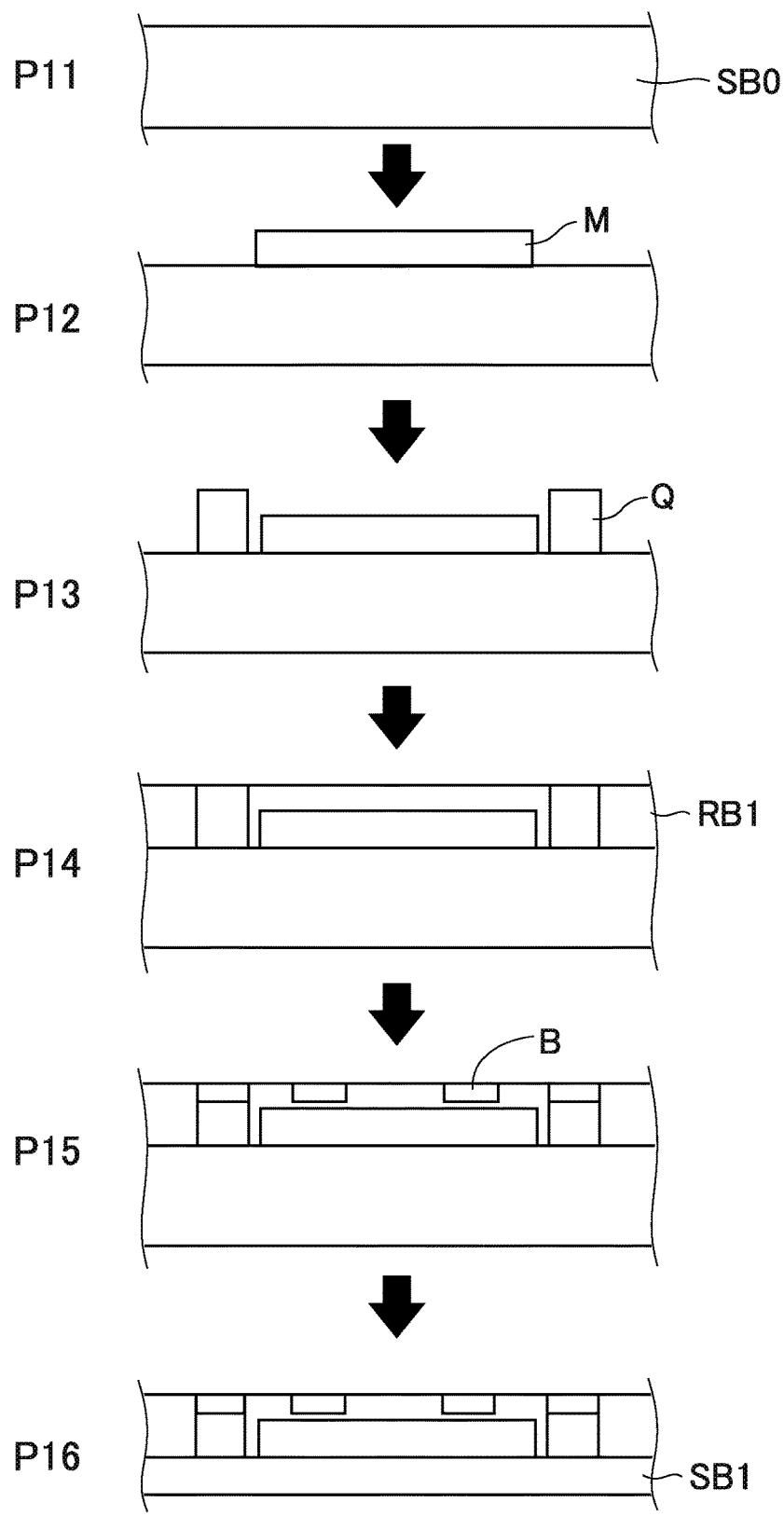
FIG. 6 is a set of views for explaining a process of manufacturing a mounting base substrate.
Figure 7:
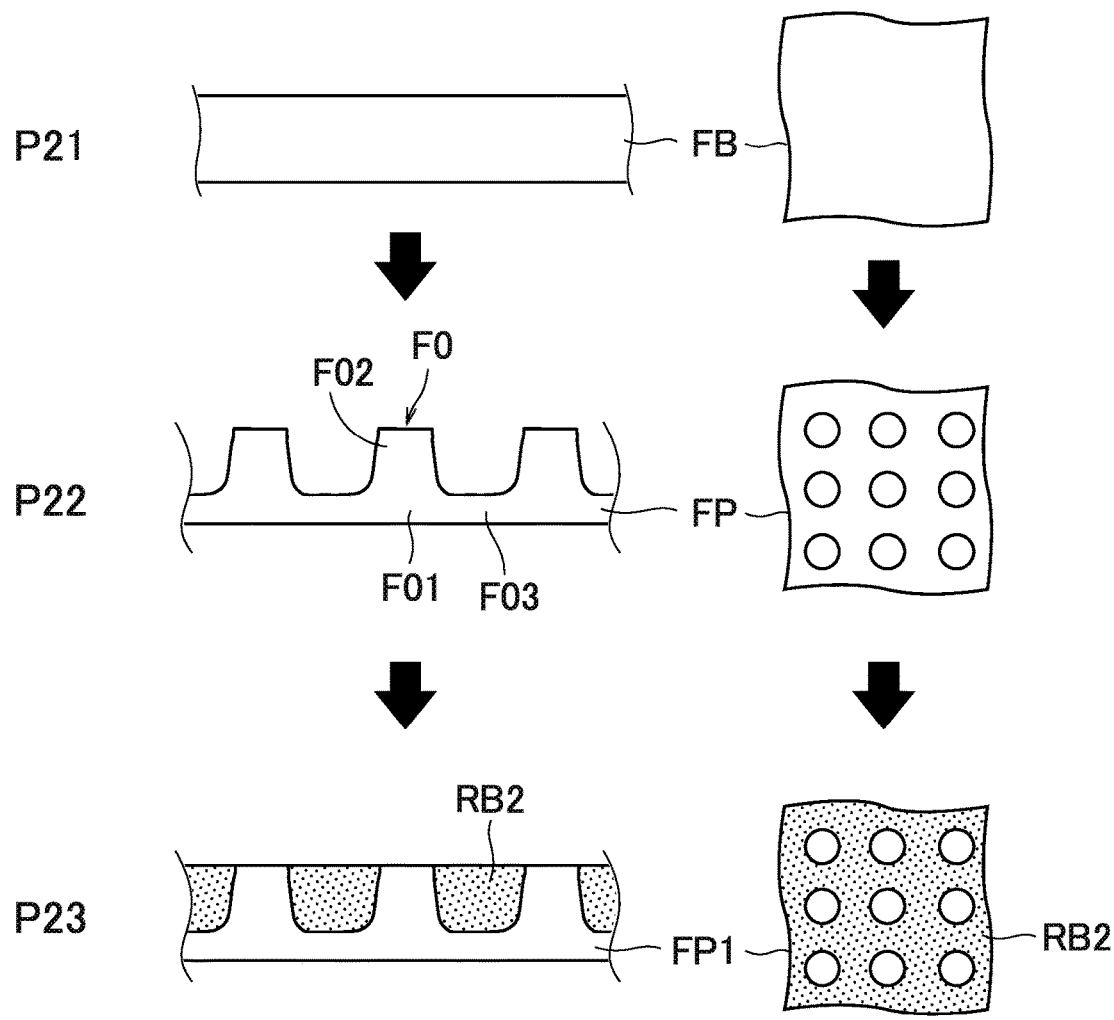
FIG. 7 is a set of views for explaining a process of manufacturing a direction changing body pattern plate.
Figure 8:
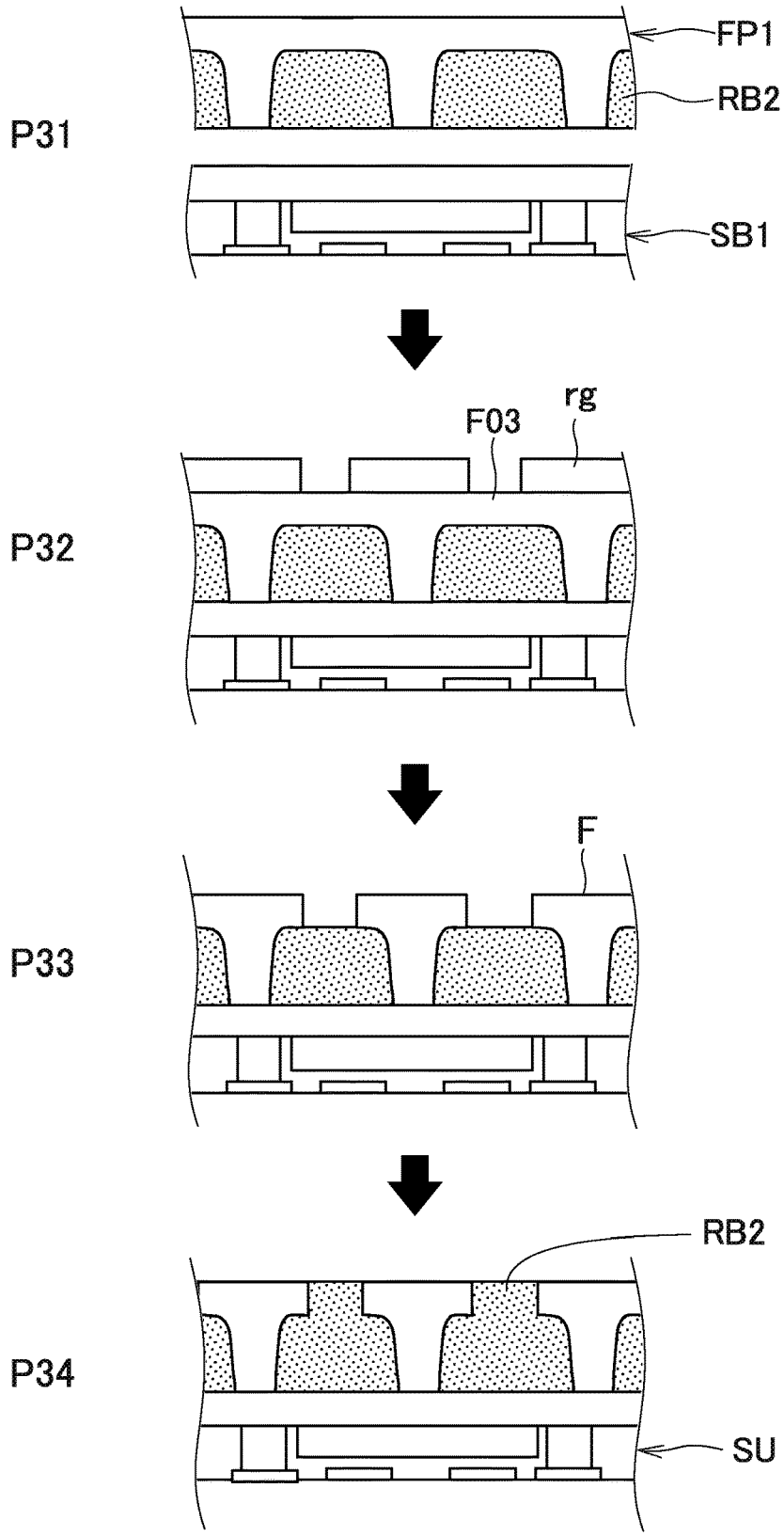
FIG. 8 is a set of views for explaining a process of manufacturing the MI sensor.

FIG. 6 to FIG. 8 illustrate manufacturing steps for the MI sensor 1. First, as illustrated in FIG. 6, a base substrate SB0 is prepared which is formed with a number of integrated circuits each comprising the above-described pulse oscillation circuit, signal processing circuit, and calculation circuit on or in a silicon wafer (step P11). A number of MI elements M are mounted on predetermined positions at one surface side of the base substrate SB0 using flip-chip bonding (step P12). Cu posts Q for power delivery for integrated circuits and communication input/output are formed on the base substrate SB0 using photolithography (step P13), the surface is covered and filled with an insulating resin RB1 (step P14), and thereafter bumps B for connection to external circuits are further formed (step P15). Finally, the other surface side of the base substrate SB0 is polished (backgrinding) and a mounting base substrate SB1 is thus obtained (step P16).

Next, as illustrated in FIG. 7, a soft magnetic plate FB of permalloy is prepared which has a size corresponding to that of the mounting base substrate SB1 (step P21). This soft magnetic plate FB is half-etched using photolithography (step P22). During this etching, the surface portion of the soft magnetic plate FB is eaten away into tapered shapes such that the surface side is wider while the inside is narrower. This allows direction changing body patterns to be self-formed such that a number of islands F0 each having a shape of frustum of circular core are arranged. Each island F0 is formed with a contracted part F02 at the surface side and an expanded part F01 at the inner side. A direction changing body pattern plate FP is thus obtained in which a number of the islands F0 each having a shape of frustum of circular core are connected by a remaining part F03 of the soft magnetic plate FB. The patterned surface side of the direction changing body pattern plate FP is filled with an insulating resin RB2 to flat the surface (step P23). In this way, a direction changing body pattern plate FP1 filled with resin is obtained.

Subsequently, as illustrated in FIG. 8, the other surface side of the mounting base substrate SB1 obtained through the above-described steps and the patterned surface side of the direction changing body pattern plate FP1 filled with resin are placed opposite to each other so as to be accurately aligned and are bonded together via the insulating resin RB2 (step P31/bonding step). After the bonding, resists rg are made using photolithography at the other surface side of the direction changing body pattern plate FP1 (opposite surface side to the patterned surface side) (step P32). Then, the remaining part F03 of the direction changing body pattern plate FP1 is partially removed by etching (step P33/separating step). This process provides a state in which a magnetism collecting yoke F having the expanded part and contracted part is disposed at the center of each MI element.

The surface side is further filled with an insulating resin RB2 to flat the surface (step P34). In this way, a bonded base substrate SU (united base substrate) is obtained which has a number of MI sensors and in which the MI elements M and the magnetism collecting yokes F are accurately arranged. By dicing the bonded base substrate SU, a number of MI sensors 1 can be obtained at once (dividing step). The present example is described as an example in which the magnetism collecting yokes F are made by etching the remaining part during the bonding, but the bonding may be performed after making a plate provided with a number of the magnetism collecting yokes F which have been divided in a similar step before the bonding.

Second Example

Figure 9:
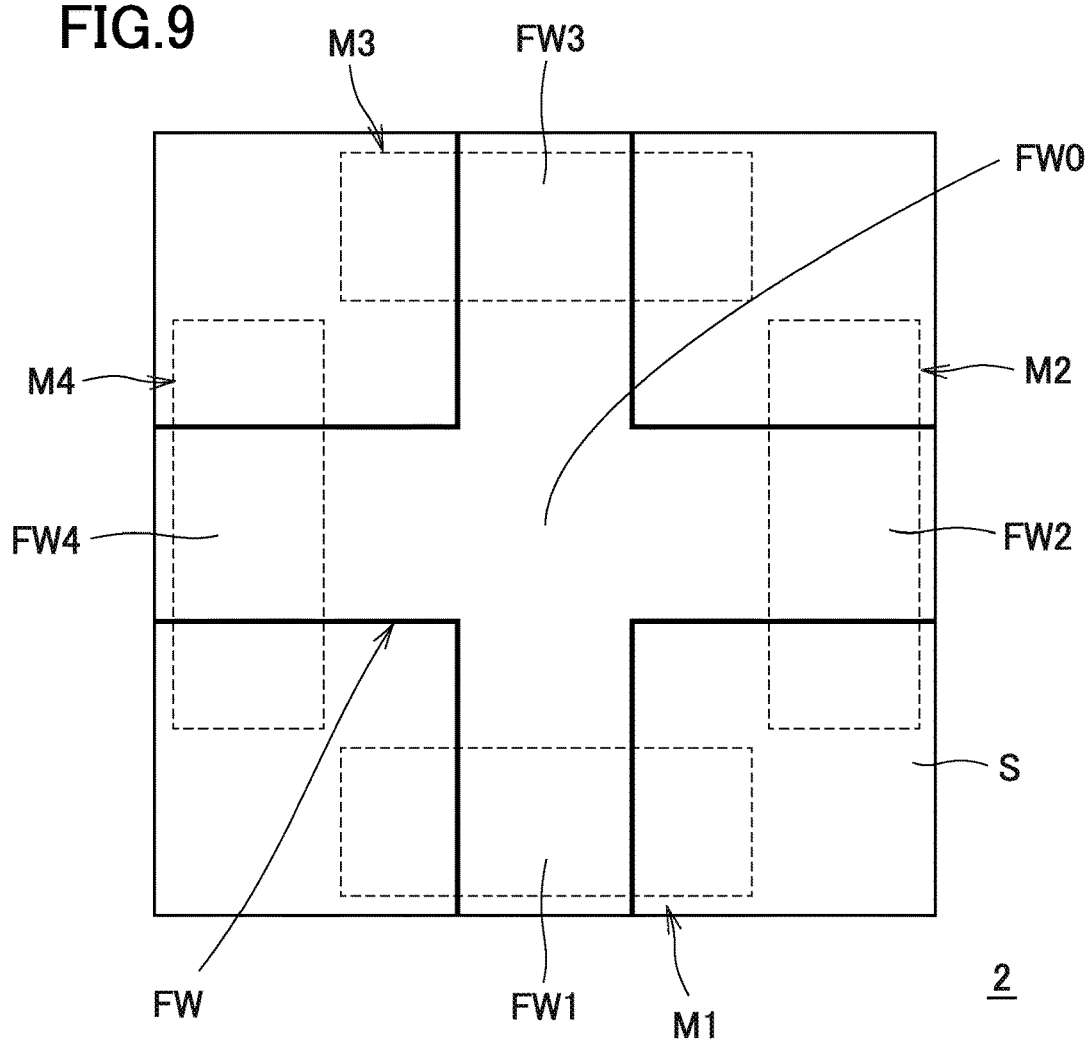
FIG. 9 is a plan view illustrating an MI sensor according to a second example.

FIG. 9 illustrates an MI sensor 2 provided with a magnetism collecting yoke F1 of which the shape is modified from that of the magnetism collecting yoke F1 in the first example. Similar components to those in the first example are denoted by the same reference characters and the description thereof will be omitted. The same applies to other examples.

The magnetism collecting yoke FW of the MI sensor 2 has a cross-like shape and disposed on the center at the other surface side of a circuit substrate S. Extending parts FW1 to FW4 of the magnetism collecting yoke FW correspond to the center positions of MI elements M1 to M4, respectively, and the magnetism collecting yoke FW has an integral structure in which the extending parts FW1 to FW4 are connected at a center part FW0. The magnetism collecting yoke FW having such a symmetric shape can also perform similar functions to those of the magnetism collecting yoke F1 and other yokes.

The MI sensor 2 comprising the magnetism collecting yoke FW can also be effectively manufactured by substituting the previously-described direction changing body pattern plate FP1 with a direction changing body pattern plate FP' (not illustrated) in which a number of square-shaped recesses are formed in a soft magnetic plate FB of permalloy using half etching.

Third Example

Figure 10:
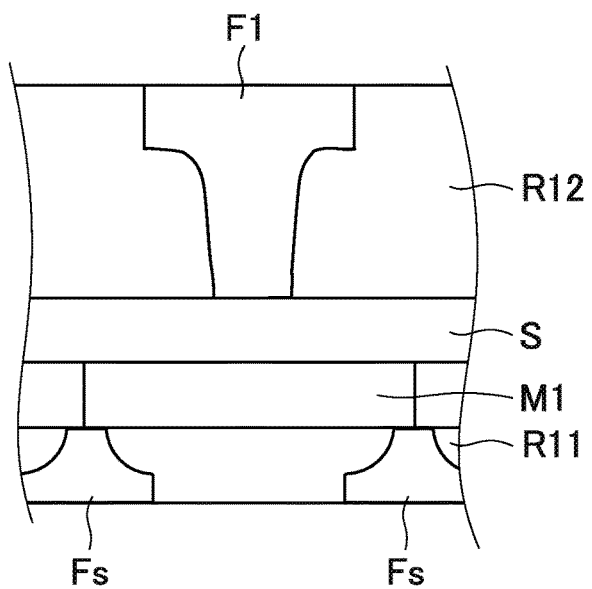
FIG. 10 is a cross-sectional view illustrating the essential part of an MI sensor according to a third example.

FIG. 10 illustrates an MI sensor 3 in which magnetism collecting yokes Fs are disposed in the vicinities of both ends at the side of MI element M1 of the circuit substrate S. Each of the magnetism collecting yokes Fs is reduced in size from the magnetism collecting yoke F1. By arranging the magnetism collecting yoke F1 (primary magnetic field direction changing body) and the magnetism collecting yokes Fs (subsidiary magnetic field direction changing bodies) in this manner, the convergence and direction change of the magnetic flux lines intersecting the circuit substrate S can be more easily controlled.

Fourth Example

Figure 11A:
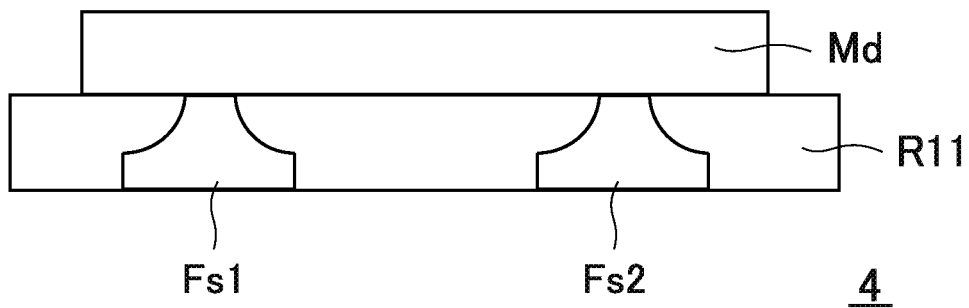
FIG. 11A is a cross-sectional view illustrating the essential part of an MI sensor according to a fourth example.
Figure 11B:
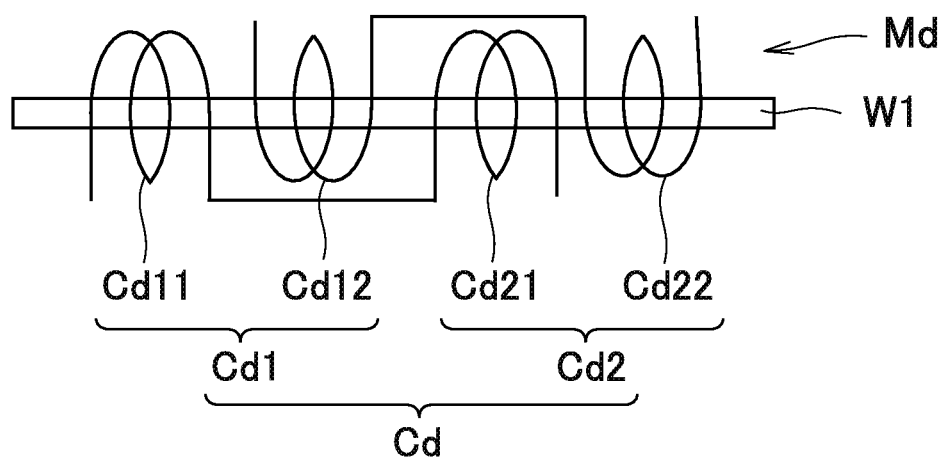
FIG. 11B is a view illustrating a connection form of its detection coils (divided coils).

FIG. 11A and FIG. 11B illustrate an MI sensor 4 in which two magnetism collecting yokes Fs1 and Fs2 are disposed evenly at intermediate positions of an MI element Md. Each of the magnetism collecting yokes Fs1 and Fs2 is reduced in size from the magnetism collecting yoke F1. Detection coil Cd of the MI sensor 4 comprises divided coil parts Cd1 and Cd2 that are divided into two units. The divided part Cd1 comprises a left-side divided coil part Cd11 and a right-side divided coil part Cd12 while the divided part Cd2 comprises a left-side divided coil part Cd21 and a right-side divided coil part Cd22. The magnetism collecting yoke Fs1 is provided at the center of the divided coil part Cd1, i.e. between the left-side divided coil part Cd11 and the right-side divided coil part Cd12 while the magnetism collecting yoke Fs2 is provided at the center of the divided coil part Cd2, i.e. between the left-side divided coil part Cd21 and the right-side divided coil part Cd22. The MI sensor 4 can detect the Z-component of an external magnetic field with high sensitivity while being reduced in size. The present example is described as an example in which the left-side divided coil part Cd11 and the left-side divided coil part Cd21 have the same polarity (winding direction) and the right-side divided coil part Cd12 and the right-side divided coil part Cd22 have the same polarity (winding direction), but these four coil parts may be independently designed.

Fifth Example

Figure 12A:
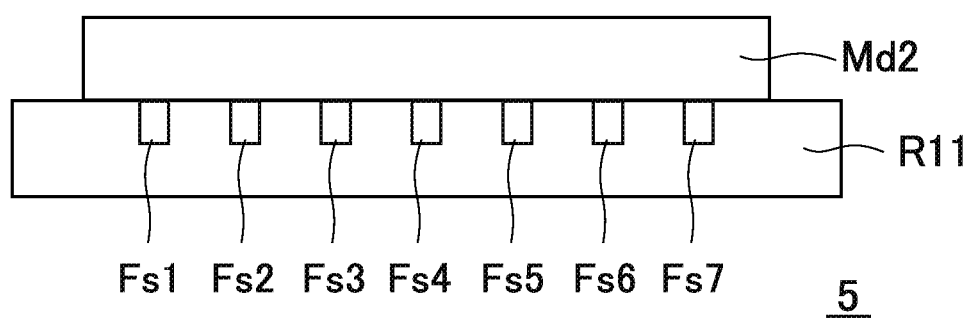
FIG. 12A is a cross-sectional view illustrating the essential part of an MI sensor according to a fifth example.
Figure 12B:
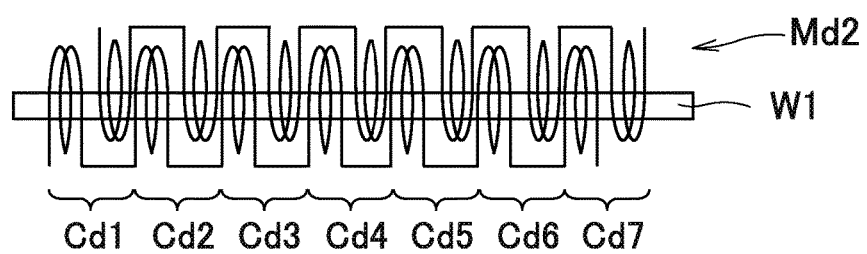
FIG. 12B is a view illustrating a connection form of its detection coils (divided coils).

FIG. 12A and FIG. 12B illustrate an MI sensor 5 in which, for further reduced size and thickness, the detection coil is modified to be seven-divided coil parts Cd1 to Cd7 from the two-divided type and the magnetism collecting yoke comprises seven magnetism collecting yokes Fs1 to Fs7.

Figure 13:
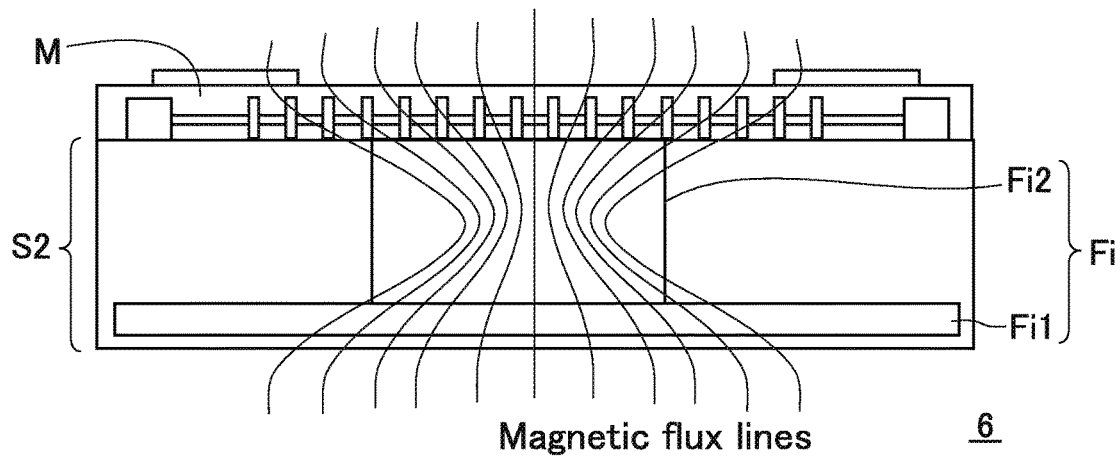
FIG. 13 is a view illustrating a cross section of an MI sensor according to a sixth example and also illustrating magnetic flux lines in the Z-axis direction which act on the MI sensor.

Sixth Example (1) FIG. 13 illustrates an MI sensor 6 that is configured such that the above-described circuit substrate S is substituted with an embedding circuit substrate S2 (corresponding to the "substrate" as referred to in the present invention) in which a magnetism collecting yokes Fi is embedded. Like the magnetism collecting yoke F1 and other yokes, the magnetism collecting yoke Fi is composed of permalloy and has a large-diameter circular plate-like expanded part Fi1 and a solid cylinder-like contracted part Fi2 that extends from the expanded part Fi1. The action and effect of the magnetism collecting yoke Fi and the operation of the MI sensor 6 are similar to those in the case of the MI sensor 1.

In the embedding circuit substrate S2 of the present example in which the magnetism collecting yoke Fi is embedded, the distance between the magnetism collecting yoke Fi and the MI element M can be further reduced than that in the MI sensor 1 illustrated in FIG. 5. Consequently, not only the MI sensor itself can be reduced in thickness and size, but also the sensitivity of the MI sensor can be enhanced. For example, the present inventors have confirmed that the output (sensitivity) of the MI sensor increases to about 3.5 times when the distance between the upper surface of the magnetism collecting yoke and the magneto-sensitive wire is reduced to one fifth (e.g. from 0.1 mm to 0.02 mm).

Moreover, by employing the substrate in which the magnetism collecting yoke is embedded, it is possible to improve the general versatility and obtain other advantages. Furthermore, by expanding the area of the expanded part of the magnetism collecting yoke, the property of collecting magnetism for the Z-component of an external magnetic field is improved and it is possible both to reduce the thickness of the expanded part and to obtain high sensitivity in detecting the Z-component of an external magnetic field.

Figure 14:
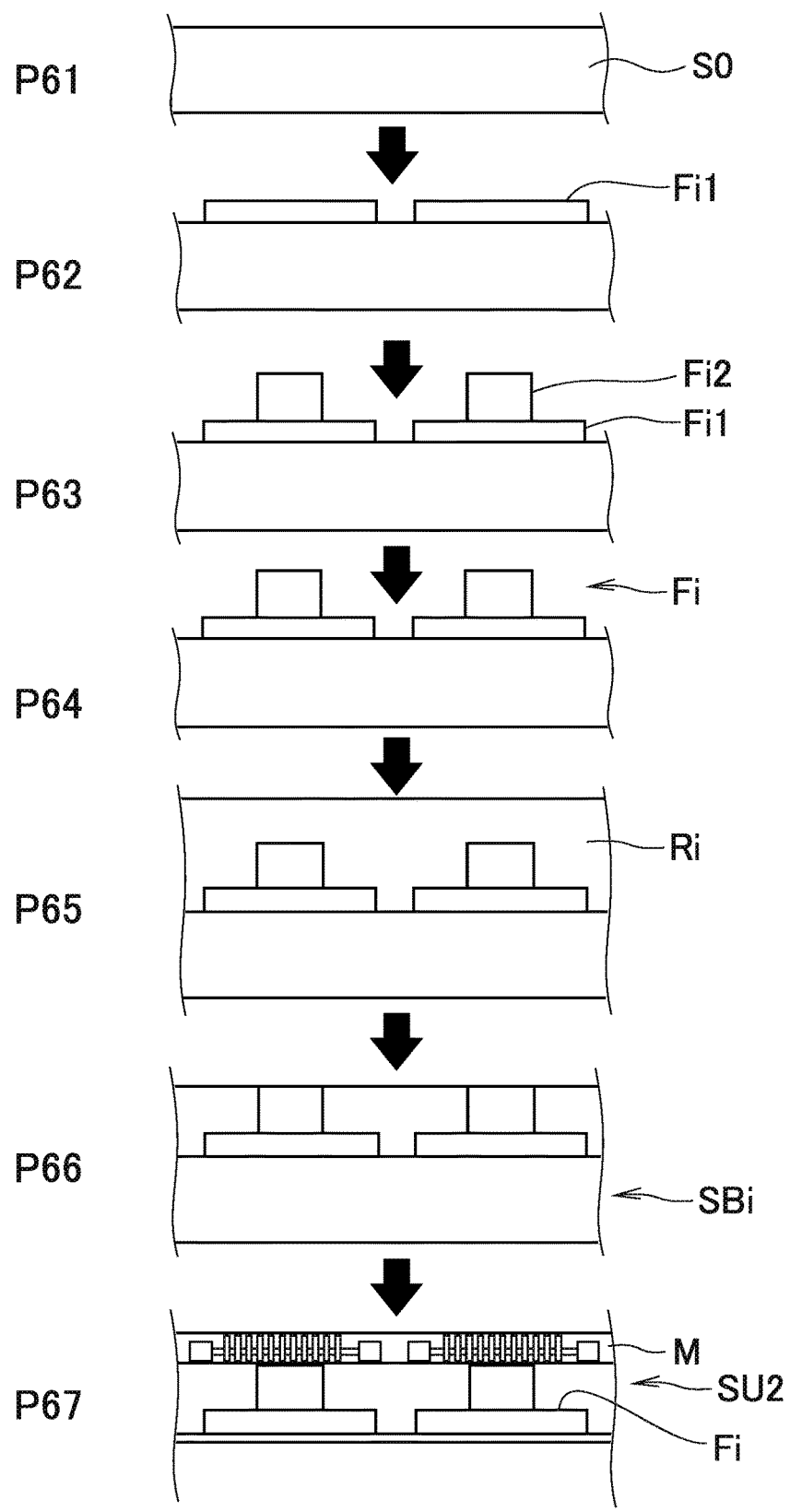
FIG. 14 is a set of views for explaining a process of manufacturing the MI sensor.

(2) The embedding circuit substrate S2 may be manufactured, for example, through steps as illustrated in FIG. 14. First, a Si substrate S0 of a silicon wafer is prepared (step P61). This Si substrate S0 is the same as the Si substrate used for manufacturing the circuit substrate S.

First plating layers of permalloy to be the expanded parts Fi1 are formed on the Si substrate S0 (step P62). Then, second plating layers of permalloy to be the contracted parts Fi2 are formed on the first plating layers (step P63). Steps of forming these plating layers (plating steps) are performed using photolithography.

The expanded parts Fi1 and contracted parts Fi2 thus formed and laminated are subjected to heat treatment (annealing) (step P64). This heat treatment removes the inner stresses caused in the expanded parts Fi1 and contracted parts Fi2 during the plating steps, and magnetism collecting yokes Fi can be obtained which comprise the expanded parts Fi1 and contracted parts Fi2 excellent in the soft magnetic properties.

An insulating resin layer Ri surrounding the magnetism collecting yokes Fi formed on the Si substrate S0 is formed by resin molding (step P65). The upper end surface of the insulating resin layer Ri is polished to be flat (step P66). After the heat treatment step (step P64) and before the polishing step (step P66), circuits necessary for driving MI sensors 6 are formed. In this way, an embedding base substrate SBi in which the magnetism collecting yokes Fi are embedded is obtained.

MI elements M are mounted on the embedding base substrate SBi, such as using flip-chip bonding (step P67/ mounting step). Subsequently, steps as illustrated in FIG. 6 are performed for polishing (backgrinding) of one surface side of the embedding base substrate SB1 (the other surface side of the Si substrate S0), etc. A united base substrate SU2 is thus obtained. By dicing this united base substrate SU2 (dividing step), a number of MI sensors 6 can be obtained. Each MI sensor may be formed on the surface of the embedding base substrate SBi or the like using a method as described in detail in WO2014/054371, etc.

REFERENCE SIGNS LIST

1: MI sensor (Magnetic detection device)
M1: MI element
W1: Magneto-sensitive wire
C1: Detection coil
C11: Left-side coil part
C12: Right-side coil part
F1: Magnetism collecting yoke (Magnetic field direction changing body)
S: Circuit substrate (Substrate)

The invention claimed is:

1. A magnetic detection device comprising:
a substrate; and
a first magneto-impedance element (referred to as an "MI element") disposed at one surface side of the substrate and comprising a first magneto-sensitive wire and a first detection coil, the first magneto-sensitive wire sensing an external magnetic field component in a first axis direction in which the first magneto-sensitive wire extends, the first detection coil looping around the first magneto-sensitive wire,
the first detection coil comprising a left-side coil part and a right-side coil part that coexist along the one continuous first magneto-sensitive wire,
the magnetic detection device further comprising a magnetic field direction changing body composed of a soft magnetic material of which at least a part is disposed at another surface side of the substrate or in the substrate above an intermediate position between the left-side coil part and the right-side coil part, the magnetic field direction changing body being able to change the external magnetic field component in a third axis direction to a measurement magnetic field having a component in the first axis direction, the third axis direction intersecting the substrate, the external magnetic field component in the third axis direction being able to be detected on a basis of a left-side output obtained from the left-side coil part and a right-side output obtained from the right-side coil part.

2. The magnetic detection device as recited in claim 1, wherein the magnetic field direction changing body has a contracted part at a near side to the first magneto-sensitive wire and has an expanded part at a far side from the first magneto-sensitive wire.

3. The magnetic detection device as recited in claim 1, wherein the left-side coil part and the right-side coil part have same number of turns,
wherein the magnetic detection device further comprises a calculation circuit that detects the external magnetic field component in the third axis direction using a difference or a sum of the left-side output and the right-side output in accordance with winding directions of the left-side coil part and the right-side coil part.

4. The magnetic detection device as recited in claim 3, wherein the calculation circuit includes a switching circuit that switches between the difference and the sum of the left-side output and the right-side output to enable detection of the external magnetic field component in the first axis direction and the external magnetic field component in the third axis direction.

5. The magnetic detection device as recited in claim 1, wherein the magnetic detection device further comprises a second MI element disposed at the one surface side of the substrate and comprising a second magneto-sensitive wire and a second detection coil, wherein the second magneto-sensitive wire extends in a second axis direction different from the first axis direction and senses an external magnetic field component in the second axis direction, wherein the second detection coil loops around the second magneto-sensitive wire.

6. The magnetic detection device as recited in claim 1, wherein the magnetic detection device further comprises a pair of a subsidiary magnetic field direction changing body in addition to the magnetic field direction changing bodies, wherein the pair of the subsidiary magnetic field direction changing bodies assists the magnetic field direction changing body to change a direction of the external magnetic field component, wherein the pair of the subsidiary magnetic field direction changing bodies is symmetrically located to the magnetic field direction changing body.

7. The magnetic detection device as recited in claim 1, wherein the detection coil comprises a plurality of divided coil parts,
wherein the magnetic field direction changing body comprises a plurality of magnetic field direction changing bodies each disposed at an intermediate position between the divided coil parts.

* * * * *